US012698025B2

(12) United States Patent
Midorikawa et al.

(10) Patent No.: US 12,698,025 B2
(45) Date of Patent: Aug. 4, 2026

(54) STEERING, STEERING SYSTEM, METHOD FOR CONTROLLING STEERING, AND NON-TEMPORARY COMPUTER READABLE STORAGE MEDIA

(71) Applicant: Autoliv Development AB, Vargarda (SE)

(72) Inventors: Yukinori Midorikawa, Kanagawa (JP); Yuki Yamazaki, Kanagawa (JP); Yuta Ozawa, Kanagawa (JP); Toshiaki Ebana, Kanagawa (JP)

(73) Assignee: Autoliv Development AB, Vårgårda (SE)

( * ) Notice: Subject to any disclaimer, the term of this patent is extended or adjusted under 35 U.S.C. 154(b) by 724 days.

(21) Appl. No.: 16/972,455

(22) PCT Filed: May 20, 2019

(86) PCT No.: PCT/JP2019/019928
§ 371 (c)(1),
(2) Date: Dec. 4, 2020

(87) PCT Pub. No.: WO2019/235200
PCT Pub. Date: Dec. 12, 2019

(65) Prior Publication Data
US 2021/0163055 A1 Jun. 3, 2021

(30) Foreign Application Priority Data
Jun. 6, 2018 (JP) ................................ 2018-108567

(51) Int. Cl.
*B62D 1/06* (2006.01)
*B62D 1/04* (2006.01)
(Continued)

(52) U.S. Cl.
CPC ............ *B62D 1/065* (2013.01); *B62D 1/046* (2013.01); *B62D 6/00* (2013.01); *H03K 17/962* (2013.01)

(58) Field of Classification Search
CPC .......... B62D 1/065; B62D 1/046; B62D 6/00; H03K 17/962
See application file for complete search history.

(56) References Cited

U.S. PATENT DOCUMENTS 10,232,858 B2 * 3/2019 Odate .................. H05B 1/0236
10,252,741 B2 * 4/2019 Okazaki .............. G01D 5/2405
(Continued)

FOREIGN PATENT DOCUMENTS

CN 105074862 A 11/2015
EP 2028078 A1 2/2009
(Continued)

*Primary Examiner* — Adam D Tissot
*Assistant Examiner* — Torrence S Marunda, II
(74) *Attorney, Agent, or Firm* — Matthew D. Thayne; Thayne and Davis LLC

(57) ABSTRACT

With the steering wheel, steering system, method of controlling steering, and non-temporary computer readable storage media, a grasp detection function can be applied to a steering wheel with a heating function, where one function can contribute to the improvement of the other function. The steering wheel includes a core part to which ground potential is supplied, a first conductor provided on the exterior of the core part and insulated from the core part, and a second conductor provided on the exterior of the first conductor and insulated from the first conductor to sense gripping of the steering wheel.

14 Claims, 8 Drawing Sheets

(51) Int. Cl.
    *B62D 6/00*        (2006.01)
    *H03K 17/96*     (2006.01)

(56)            References Cited

U.S. PATENT DOCUMENTS

| | | | |
|---|---|---|---|
| 10,640,138 B2 * | 5/2020 | Fujikawa | B60R 16/037 |
| 11,511,687 B2 * | 11/2022 | Odate | B60R 16/027 |
| 2005/0242965 A1 | 11/2005 | Rieth et al. | |
| 2015/0369633 A1 | 12/2015 | Karasawa et al. | |
| 2016/0101805 A1 * | 4/2016 | Nishio | H05B 1/0236 |
| | | | 219/204 |
| 2017/0129499 A1 | 5/2017 | Odate | |
| 2017/0282956 A1 * | 10/2017 | Odate | H05B 3/06 |

FOREIGN PATENT DOCUMENTS

| | | |
|---|---|---|
| EP | 2955737 A1 | 12/2015 |
| JP | 63-305074 A | 12/1988 |
| JP | H0976922 A | 3/1997 |
| JP | 2005-537992 A | 12/2005 |
| JP | 2010023699 A | 2/2010 |
| JP | 2014-190856 A | 10/2014 |
| JP | 2015-131544 A | 7/2015 |
| JP | 2017-087883 A | 5/2017 |
| JP | 2017-178133 A | 10/2017 |
| WO | 2004/022409 A2 | 3/2004 |
| WO | 2014/123222 A1 | 8/2014 |

* cited by examiner

[FIG. 1]
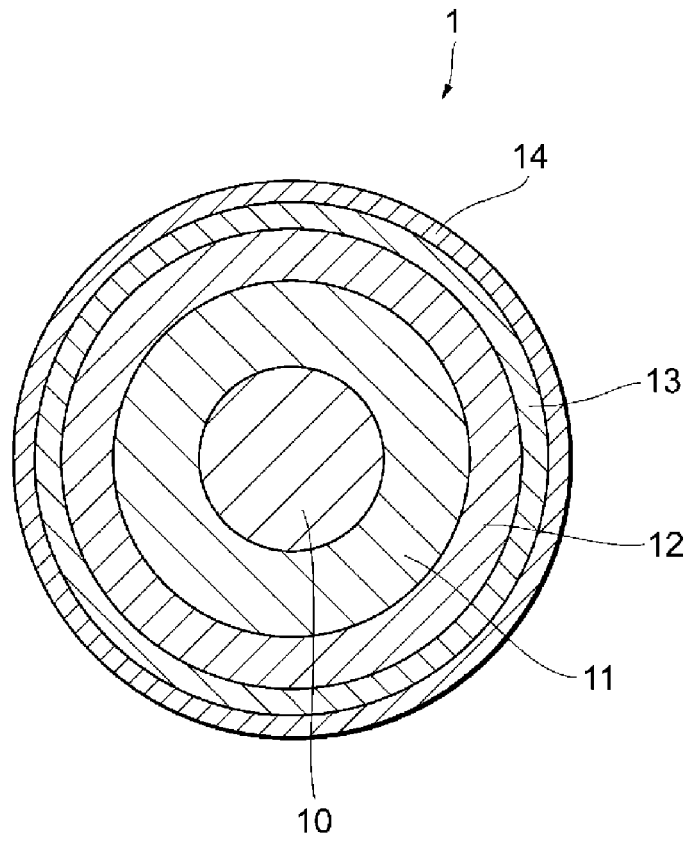

[FIG. 2]
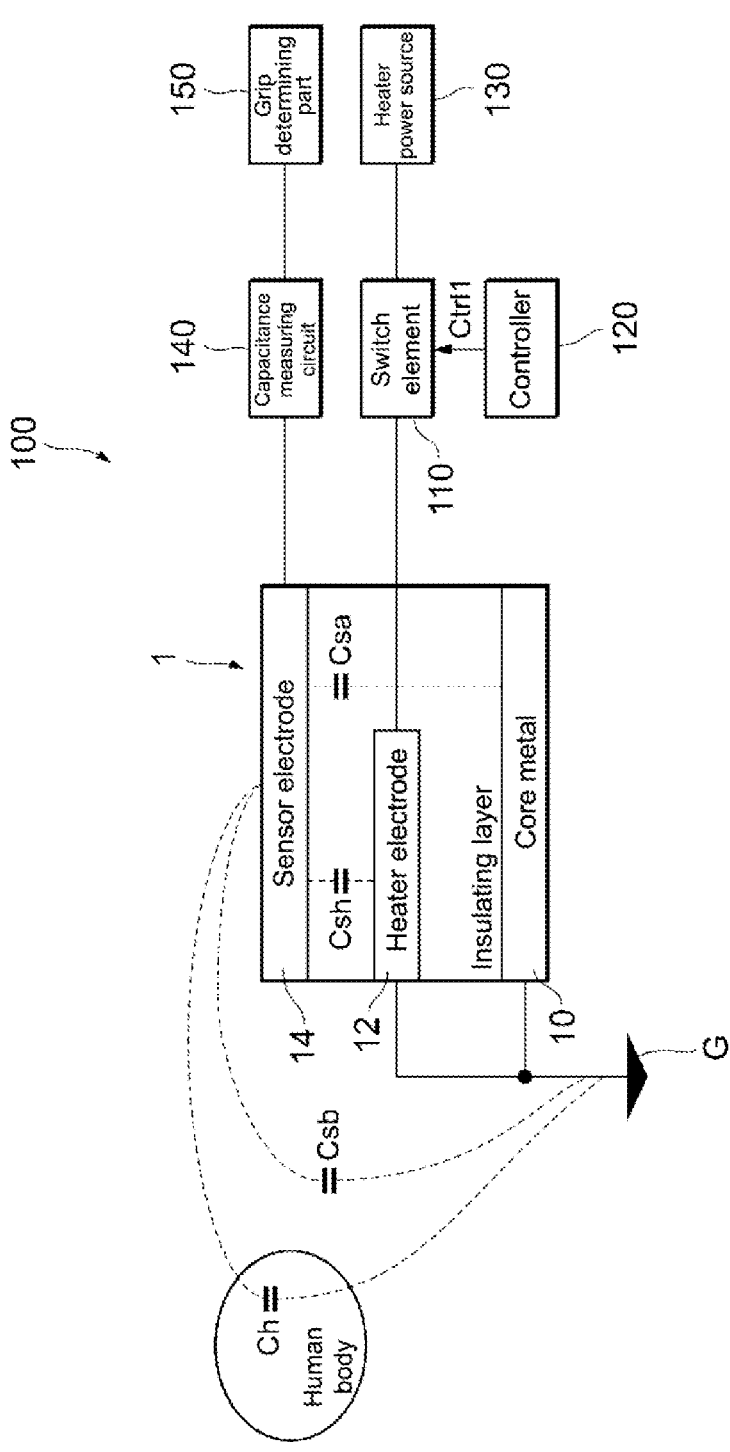

[FIG. 3]
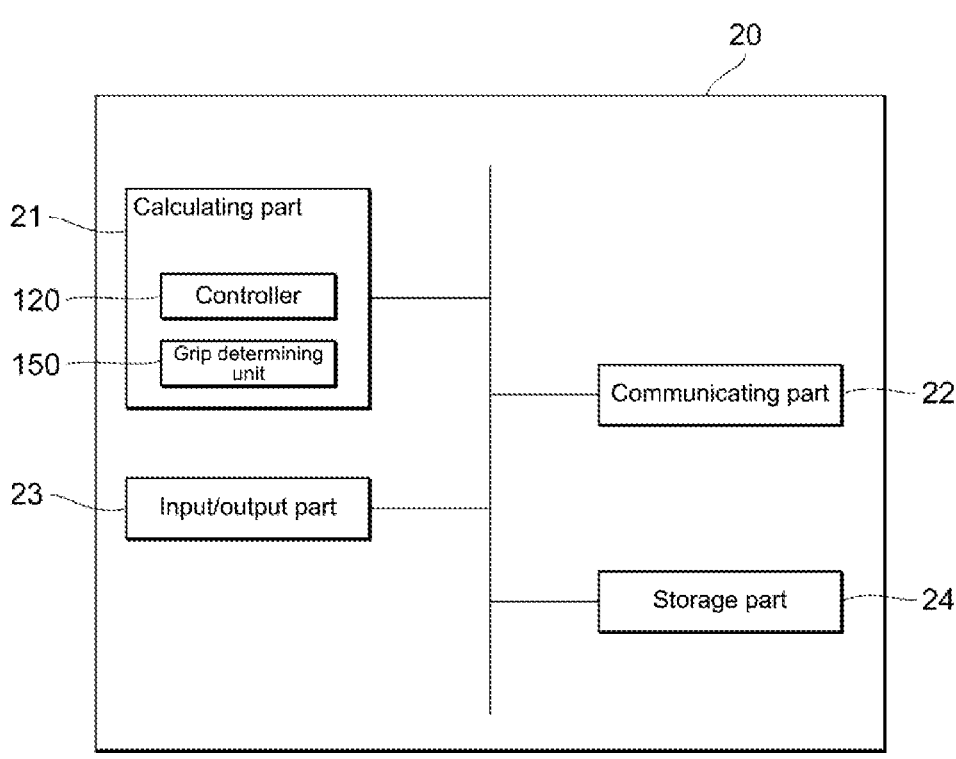

[FIG. 4]
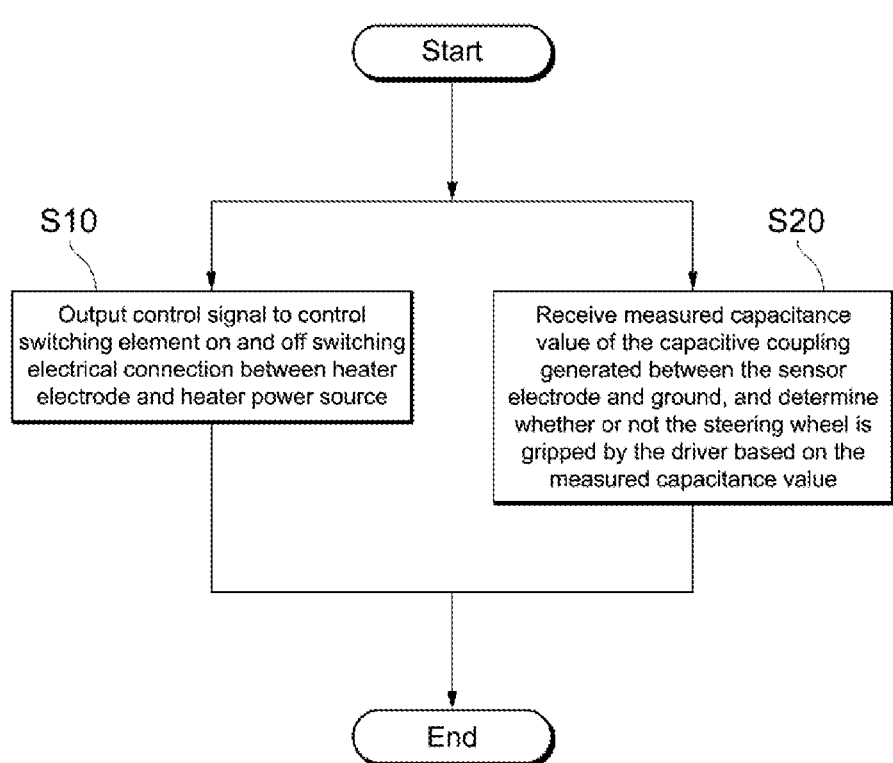

[FIG. 5]
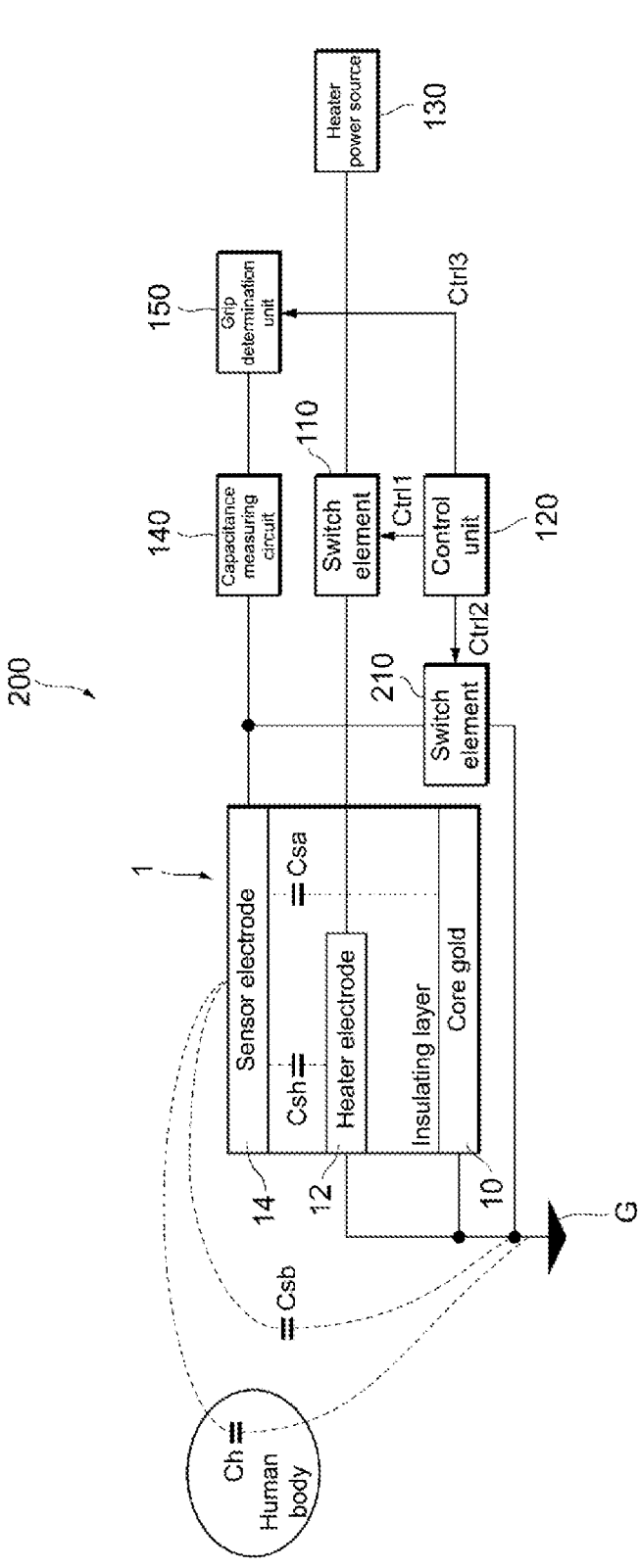

[FIG. 6]
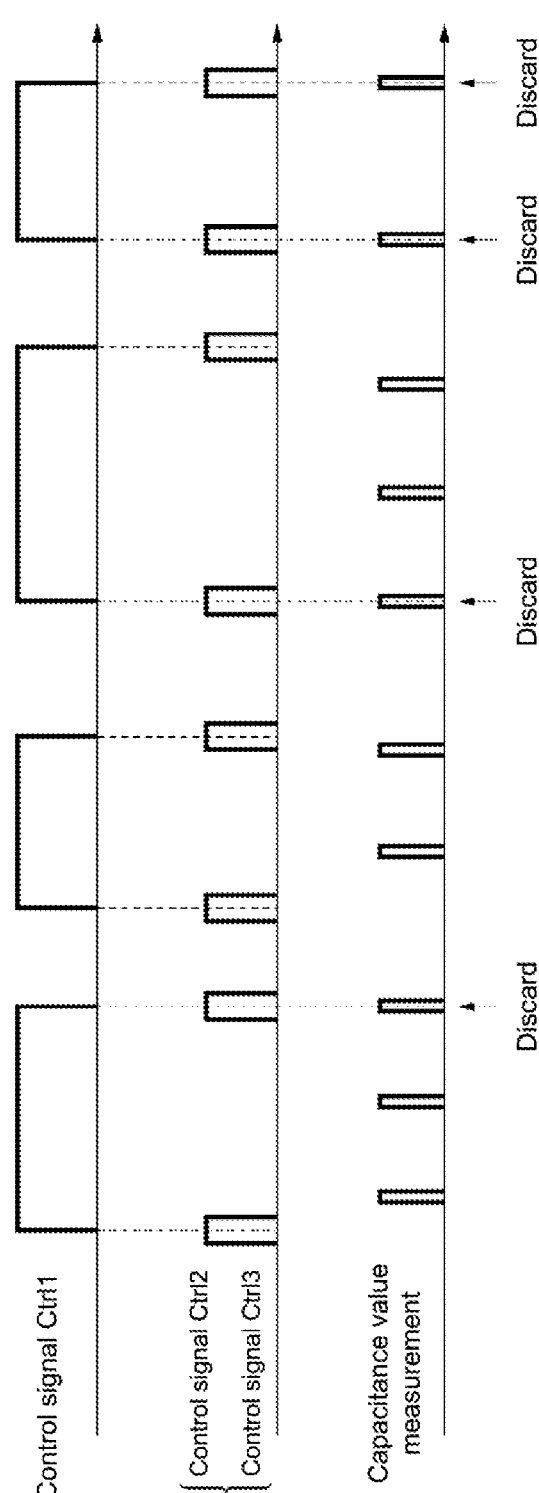

[FIG. 7]
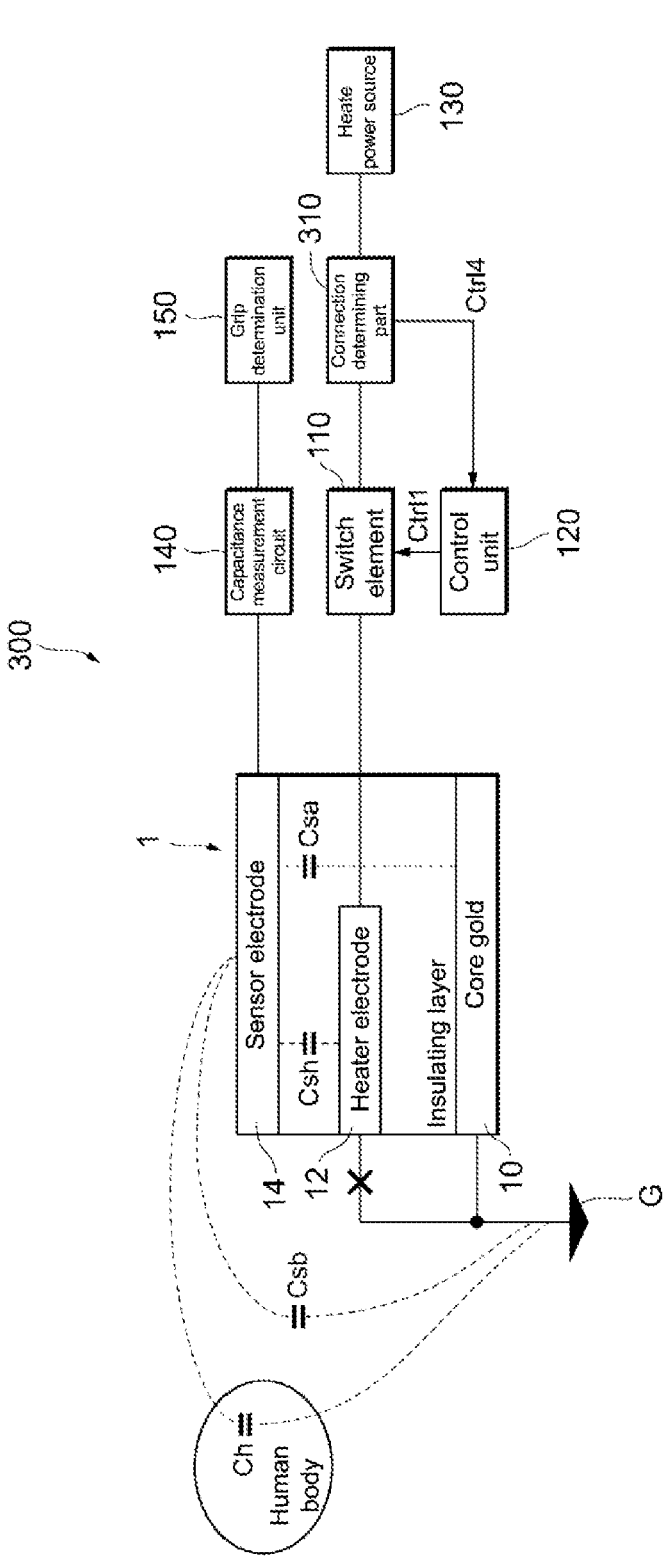

[FIG. 8]
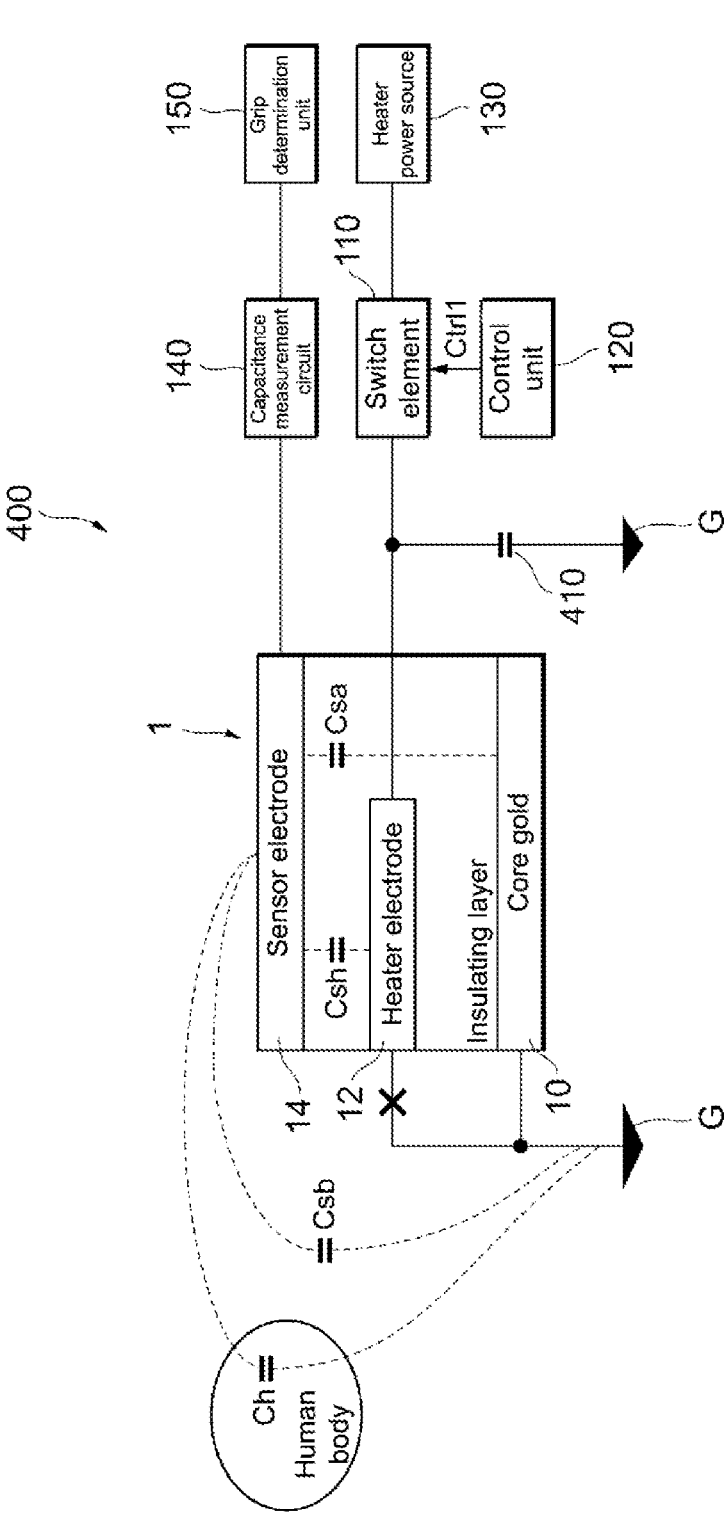

STEERING, STEERING SYSTEM, METHOD FOR CONTROLLING STEERING, AND NON-TEMPORARY COMPUTER READABLE STORAGE MEDIA

TECHNICAL FIELD

The present invention is related to steering, a steering system, a method for controlling steering, and non-temporary computer readable storage media.

BACKGROUND

Conventionally, heaters have been developed to heat steering wheels of automobiles for comfortable operation of the vehicle on cold days, such as in winter. For example, Patent Document 1 describes an automotive heating device that includes a heating element mounted to cover the steering wheel, a control circuit configured to control energization of the heating element, and a switch that outputs a signal to the control circuit. In this automotive heating device, energization to the heating element is initiated by the operation of the switch by the driver and stopped after a prescribed period of time.

Another conventionally known technology is providing a capacitive touch sensor on the steering wheel to detect whether or not the driver is grasping the steering wheel (for example, see Patent Document 2).

RELATED ART DOCUMENTS

Patent Documents

[Patent Document 1] Japanese Unexamined Patent Application H09-76922
[Patent Document 2] Japanese Unexamined Patent Application 2010-23699

SUMMARY OF THE INVENTION

Problem to be Solved by the Invention

However, there has not been sufficient consideration for installing a heater and a touch sensor together in a steering wheel conventionally, and this needs to be improved.

Therefore, an object of the present invention is to provide a steering device, a steering system, a method for controlling steering, and non-temporary computer readable storage media that are capable of adding a grasp detection function to a steering device with a heater function, of which one function can contribute to improving the other function.

Means for Solving the Problem

The steering wheel according to one embodiment of the present invention is a steering wheel provided with a core part to which a ground potential is supplied, provided with a first conductor insulated from the core part on the exterior of the core part for warming the steering wheel, and a second conductor insulated from the first conductor on the exterior of the first conductor for detecting grasping of the steering wheel.

The method of controlling the steering wheel according to one embodiment of the present invention is a method of controlling a steering wheel provided with a first conductor for warming the steering wheel and a second conductor insulated from the first conductor on the exterior of the first conductor, and includes a step of outputting a first control signal that controls the ON and OFF actions of a first switching part that switches an electrical connection between one end of the first conductor and a power supply, and a step in determining whether or not the steering wheel is being grasped by the driver based on capacitance measurement results of capacitive coupling produced between the second conductor and the grounding part.

The non-temporary computer readable storage media according to one embodiment of the present invention is a non-temporary computer readable storage media storing one or more programs that are configured to be executed by one or more processors of an electronic device and one or more programs that allow the electronic device to control the steering wheel, of which the steering wheel is provided with a first conductor for heating the steering wheel and a second conductor insulated from the first conductor on the exterior of the first conductor, wherein the one or more programs include a command to output a first control signal to control the ON and OFF actions of a first switching part to switch the electrical connection between one end of the first conductor and a power supply, and a command to determine whether or not the driver is grasping the steering wheel based on capacitance measurement results of capacitive coupling produced between the second conductor and the grounding part.

According to these embodiments, the first conductor for the heating function is protected by the second conductor for the grasp detection function, as the second conductor is provided on the exterior of the first conductor. Herewith, when the driver grasps the steering wheel, the first conductor is not directly grasped, such that increase in resistance of the first conductor over time due to wear can be suppressed. Therefore, both functions can be provided to the steering wheel while achieving a synergistic effect of the second conductor for grasp detection function improving the durability of the first conductor for heating function.

Note that "grasp" in these specifications is not limited to the driver grasping on the steering wheel tightly, and also includes a state in which the body of the driver touches a part of the steering wheel.

Effect of the Invention

With the steering wheel, steering system, method of controlling steering, and non-temporary computer readable storage media of the present invention, a grasp detection function can be applied to a steering wheel with a heating function, where one function can contribute to the improvement of the other function.

BRIEF DESCRIPTION OF THE DRAWINGS

FIG. 1 is a diagram illustrating a cross-sectional structure of a steering wheel according to embodiment 1.

FIG. 2 is a diagram illustrating a circuit configuration and system configuration of the steering system according to embodiment 1.

FIG. 3 is a block diagram illustrating the computer hardware configuration included with the steering system according to embodiment 1.

FIG. 4 is a flowchart illustrating a method of controlling the steering wheel according to embodiment 1.

FIG. 5 is a diagram illustrating a circuit configuration and system configuration of the steering system according to embodiment 2.

FIG. 6 is a timing chart of the steering system according to embodiment 2.

FIG. 7 is a diagram illustrating a circuit configuration and system configuration of the steering system according to embodiment 3.

FIG. 8 is a diagram illustrating a circuit configuration and system configuration of the steering system according to embodiment 4.

EMBODIMENT OF THE INVENTION

Embodiments of the present invention are described with reference to the accompanying diagrams below. In each diagram, the same reference numerals designate identical or similar configurations. In addition, in the second and subsequent embodiments, descriptions of items common to the first embodiment will be omitted, and only different points will be described. In particular, successive references are not made for similar effects of similar configurations for each embodiment.

1. Embodiment 1

The steering wheel 1 is an operating device for operating the driving of a vehicle, and has a heater function that warms the steering wheel itself, and a grasp detection function for detecting whether or not the steering wheel is grasped by the driver. As illustrated in FIG. 1, the steering wheel 1 includes, in order from the interior, a core metal 10, a urethane layer 11, a heater electrode 12, an outer skin layer 13, and a sensor electrode 14. The core metal 10 is an example of a core part, and the heater electrode 12 and the sensor electrode 14 are respectively examples of a first conductor and a second conductor.

The core metal 10 makes up the framework portion of the steering wheel 1 and forms the shape of the steering wheel 1. The core metal 10 is electrically connected to the grounding part of the vehicle where the steering wheel 1 is attached to the vehicle, and as such, the core metal 10 is at ground potential. In other words, ground potential is supplied to the core metal 10. Note that the "grounding part" of the vehicle can be any location as long as the vehicle has a ground potential, and includes, for example, a vehicle body or the like.

The urethane layer 11 is provided covering the core metal 10 on the exterior (outer periphery in the present embodiment) of the core metal 10, and insulates the core metal 10 and the heater electrode 12. Note that the type of this insulation is not limited to the urethane layer 11, and can be formed, for example, by using other materials other than urethane.

The heater electrode 12 is provided covering the urethane layer 11 on the exterior (outer periphery in the present embodiment) of the urethane layer 11. The heater electrode 12 generates heat when supplied with power, thereby warming the steering wheel 1. For example, the heater electrode 12 is formed by a planar heating element having a nichrome wire arranged in a planar shape.

The outer skin layer 13 is provided covering the heater electrode 12 on the exterior (outer periphery in the present embodiment) of the heater electrode 12, and insulates the heater electrode 12 and the sensor electrode 14. The material constituting the outer skin layer 13 is not particularly limited, and can be, for example, a leather conventionally used as an outer skin layer of steering wheels.

The sensor electrode 14 is provided covering the outer skin layer 13 on the exterior (outer periphery in the present embodiment) of the outer skin layer 13. The sensor electrode 14 is an electrode for detecting by capacitive coupling whether or not the driver of the vehicle is grasping the steering wheel 1. For example, the sensor electrode 14 is formed by spraying a conductive paint on the surface of the outer skin layer 13. The function of detecting the grasping of the steering wheel 1 by the driver can be applied, for example, to a driving assistance system that assists the driver or to an alert system that alerts the driver. Note that the position where the sensor electrode 14 is provided need not necessarily be the outermost part of the steering wheel 1, and the steering wheel 1 can have a non-conducting coating applied to a further exterior part of the sensor electrode 14, for example.

Thus, regarding the steering wheel 1, the heater electrode 12 and the sensor electrode 14 are formed so as to surround the core metal 10 in this order while the heater electrode 12 and the sensor electrode 14 are insulated from each other. In the example illustrated in FIG. 1, the heater electrode 12 and the sensor electrode 14 are formed over the entire circumference of the steering wheel 1, in other embodiments however, the heater electrode 12 and the sensor electrode 14 need not be formed over the entirety of the steering wheel 1. In other words, as long as a portion of the steering wheel 1 (for example, a portion that is easily grasped by the driver and the like) has the cross-sectional structure illustrated in FIG. 1, the heater electrode 12 and the sensor electrode 14 need not be formed on other portions.

As illustrated in FIG. 2, a steering system 100 includes, for example, the steering wheel 1, a switching element 110, a controller 120, a heater power supply 130, a capacitance measuring circuit 140, and a grasp determining part 150. The switching element 110, controller 120, capacitance measuring circuit 140, and grasp determining part 150 are provided, for example, on an ECU (which is an example of an electronic device). In other embodiments, the switching element 110 and the capacitance measuring circuit 140 can be provided separately from the ECU and electrically connected to the ECU. Note that because both the urethane layer 11 and the outer skin layer 13 illustrated in FIG. 1 are both included in the insulating layer in terms of the circuit configuration, the urethane layer 11 and the outer skin layer 13 are illustrated together as an insulating layer in FIG. 2. This is also true in FIG. 5, FIG. 7 and FIG. 8, which are shown below.

As illustrated in FIG. 3, an ECU 20 included in the steering system 100 includes a calculating part 21, a communicating part 22, an input/output part 23, and a storage part 24.

The calculating part 21 includes one or more processors and is made up of a CPU, an MPU, or the like. The calculating part 21 operates various functions by executing programs, modules, and/or instructions stored in the storage part 24 based on various inputs. Programs and the like can be installed from storage media such as a CD-ROM or USB memory or can be downloaded and installed via the communicating part 22. The calculating part 21 includes, for example, the controller 120 and the grasp determining part 150. The controller 120 outputs a control signal for controlling the switching element 110 ON and OFF, for example. The grasp determining part 150 determines whether or not the steering wheel 1 is grasped based on the capacitance value measured by the capacitance measuring circuit 140, for example.

The communicating part 22 is an interface for connecting the ECU 20 to other devices. The communicating part 22 can be connected to a communication network such as the Internet, for example. The input/output part 23 receives data from other devices and outputs data to other devices. For example, the input/output part 23 is connected to the switching element 110, and a control signal from the controller 120 is output to the switching element 110 via the input/output part 23. Furthermore, for example, the input/output part 23 is connected to the capacitance measuring circuit 140, and receives the measurement results of the capacitance measuring circuit 140.

The storage part 24 is made up of a storage device such as a hard disk drive, an SSD, RAM, and ROM and the like. The storage part 24 stores various programs necessary to execute the calculation processes of the calculating part 21 and data necessary for the execution of various programs, and the like. Various programs include programs for controlling steering, for example. The storage part 24 includes non-volatile memory. Non-volatile memory includes non-temporary computer readable storage media. In addition, the storage part 24 stores the capacitance values measured by the capacitance measuring circuit 140, and temporarily stores various types of information.

Returning to FIG. 2, the core metal 10 is electrically connected to the ground G of the vehicle, and the entire core metal 10 is set to ground potential. The heater electrode 12 is supplied with power from the heater power supply 130 via the switching element 110 at one end, and the other end is electrically connected to ground G. The sensor electrode 14 generates capacitive coupling with the driver while the driver is grasping the steering wheel 1. Note that in FIG. 2, electrical connections by wiring are indicated by solid lines, and electrical connections based on capacitive coupling are indicated by dashed lines.

The switching element 110 (which is an example of a first switching part) switches the electrical connection between the heater electrode 12 and the heater power supply 130 by switching between ON and OFF based of the control signal Ctrl1 (an example of the first control signal) supplied by the controller 120. Specifically, when the switching element 110 is ON, power is supplied from the heater power supply 130 to the heater electrode 12, and the heater electrode 12 generates heat. Meanwhile, when the switching element 110 is OFF, the supply of power from the heater power supply 130 to the heater electrode 12 is blocked, and heat generated by the heater electrode 12 is stopped. The switching element 110 can be a transistor such as a field-effect transistor (FET), for example, but is not limited thereto, and can be configured to switch an electrical connection in accordance with the control signal Ctrl1.

The controller 120 supplies the control signal Ctrl1 to the switching element 110 to switch the switching element 110 ON and OFF. The controller 120 can receive an input of a switch operation by the driver of the vehicle, for example, and generate the control signal Ctrl1 based on this input. The heater power supply 130 (an example of the power supply) supplies power to the heater electrode 12.

The capacitance measuring circuit 140 supplies the capacitance measurement signal to the sensor electrode 14, and measures a sum of the capacitance values of capacitive coupling that occurs between the sensor electrode 14 and each element that carries ground potential. Specifically, in a case where the driver does not grasp the steering wheel 1, or in other words, when there is no capacitive coupling between the driver and the steering wheel 1, the capacitance value Coff measured by the capacitance measuring circuit 140 is calculated by: the sum of the capacitance value Csa of the parasitic capacitance generated between the sensor electrode 14 and the core metal 10, a capacitance value Csh of the parasitic capacitance generated between the sensor electrode 14 and the heater electrode 12, and a capacitance value Csb of the parasitic capacitance generated between the sensor electrode 14 and the ground G of the vehicle. In other words, in this case, Coff=Csa+Csh+Csb.

Meanwhile, in a case where the driver grasps the steering wheel 1, or in other words, when capacitive coupling is generated between the driver and the steering wheel 1, the capacitance value Con measured by the capacitance measuring circuit 140 is calculated by: The capacitance values Csa, Csh, and Csb described above, and in addition, a capacitance value Ch of the capacitive coupling that occurs in the path from the sensor electrode 14 to the ground G of the vehicle via the human body of the driver. In other words, in this case, Con=Csa+Csh+Csb+Ch. Therefore, there will be a difference between the capacitance value Con when there is grasping of the steering wheel and the capacitance value Coff when there is no grasping, ΔC=Con−Coff=Ch.

The grasp determining part 150 determines whether or not the driver is grasping the steering wheel 1 based on the capacitance value measured by the capacitance measuring circuit 140. Specifically, the grasp determining part 150 receives the capacitance value measured by the capacitance measuring circuit 140 intermittently at prescribed intervals, for example. Furthermore, when the capacitance value increases by greater than or equal to the prescribed threshold, the grasp determining part 150 determines that the steering wheel 1 has been grasped, and when the capacitance decreases by greater or equal to the prescribed threshold, the grasp determining part 150 determines that the steering wheel 1 has been released from grasp, and determines that the previous state is maintained if the capacitance value does not change at or more than the prescribed threshold value.

In reference to FIG. 4, the method of controlling the steering wheel 1 of the present embodiment will be described. The method can be performed by the ECU 20 described above. In this method, two steps are mainly performed in this method.

First, a control signal Ctrl1 is output that controls the ON and OFF of the switching element 110 for switching the electrical connection between one end of the heater electrode 12 and the heater power supply 130 (step S10). This is executed by the controller 120. ON and OFF of the heater electrode 12 is controlled with this type of output step.

Second, in response to the measurement result of the capacitance value of the capacitive coupling generated between the sensor electrode 14 and ground G, a determination is made regarding whether or not the steering wheel 1 is being grasped by the driver based on the measured capacitance value (step S20). This is performed by the grasp determining part 150. As described above, the capacitance value is measured by the capacitance measuring circuit 140.

With the steering wheel 1 of the present embodiment, both a heating function and a grasp detection function can be provided as the steering wheel 1 is provided with the heater electrode 12 and the sensor electrode 14. In particular, the sensor electrode 14 is provided on the exterior of the heater electrode 12, and thus the external part of the heater electrode 12 is protected by the sensor electrode 14. As a result, durability of the heater electrode 12 can be improved. The following is a detailed description of this point.

In other words, the amount of heat Q generated by the heater electrode 12 is defined by $Q=RI^2$, using the current rate I supplied to the heater electrode 12 and the resistance value R of the heater electrode 12. Therefore, in order to obtain a sufficient amount of heat Q, the resistance value R of the heater electrode 12 is preferably low. Here, if the heater electrode 12 is provided on the exterior of the steering wheel 1, the heater electrode 12 is grasped directly by the driver. As a result, the resistance value R of the heater electrode 12 may increase through degradation over time due to wear. In this regard, regarding the present embodiment, as the heater electrode 12 is arranged more to the inside than sensor electrode 14, the wear described above can be suppressed, thus suppressing increase in the resistance value R. Therefore, durability of the heater electrode 12 can be improved.

However, since the sensor electrode 14 is grasped directly by the driver when grasping the steering wheel 1, the resistance value can increase due to wear. However, as the resistance value between the sensor electrode 14 and the grounding part G is relatively large, even if the resistance value of the sensor electrode 14 is increased, the variation in the resistance value of the sensor electrode 14 relative to the resistance value between the sensor electrode 14 and ground G is relatively small. Therefore, wear of the sensor electrode 14 has a small effect on the measurement of the capacitance value by the capacitance measuring circuit 140. In other words, by providing the sensor electrode 14 on the exterior of the heater electrode 12, the grasp detection function can contribute to improving the durability of the heater function while adding the grasp detection function to the steering wheel with the heater function.

In other embodiments, switching ON and OFF the heater function (in other words, ON and OFF of the switching element 110) can be controlled, for example, based on the determination results from the grasp determining part 150. For example, by controlling the heater function to turn ON upon detecting grasping on the steering wheel and to turn OFF the heater function upon detecting the grasping released, the steering wheel can be automatically warmed without interfering with the driving operation by the driver.

Here, regarding the steering system 100 provided with the heater function as described above, when the heater function is ON, the amount of current supplied to the heater electrode 12 is relatively high (for example, from a few to a few tens of Amps). Therefore, because the amount of current supplied to the heater electrode 12 suddenly fluctuates when turning ON and OFF the heater function, noise may be generated or the power supply voltage may fluctuate. Therefore, the following second embodiment will be described as a steering system that can suppress the effects of such noise and voltage fluctuations on peripheral circuits.

2. Embodiment 2

As illustrated in FIG. 5, a steering system 200 further includes a switching element 210 when compared with the steering system 100 described above. The switching element 210 (example of a second switching part) is provided in between the sensor electrode 14 and the ground G, and switches the electrical connection between the sensor electrode 14 and the ground G according to the control signal Ctrl2 (example of a second control signal) supplied by the controller 120. Similar to the switching element 110, the switching element 210 can be a transistor such as a FET and the like, but is not limited thereto, as long as the electrical connections can be switched according to the control signal Ctrl2.

Regarding the present embodiment, the controller 120 outputs a control signal Ctrl2 for switching the operation of the switching element 210 in accordance with the operation of the switching element 110. Specifically, as illustrated in FIG. 6, the control signal Ctrl2 is set to a high level that turns the switching element 210 ON when the switching element 110 is switched between ON and OFF, and the signal is set to a low level that turns the switching element 210 OFF when the switching element 110 is not switched ON or OFF for a prescribed amount of time. This turns the switching element 210 ON when switching the operation of the heater function, and the sensor electrode 14 becomes electrically connected to the ground G, such that the sensor electrode 14 is set to ground potential. Accordingly, even when noise or power supply voltage fluctuation occurs as the operation of the heater function is switched, the sensor electrode 14 functions as a shield, and the effects of these noise and voltage fluctuations can be suppressed.

Note that turning ON the switching element 210 is not limited to instances where the switching element 110 turns ON or OFF, but may include a time before and after the instance, as illustrated in FIG. 6. This allows for easier suppression of the effects of noise or the like associated with switching the operation of the heater function.

Additionally, regarding the present embodiment, the controller 120, in addition to the control signal Ctrl2, outputs a control signal Ctrl3 (example of a third control signal) indicating switching ON or OFF the switching element 110 and supplies this signal to the grasp determining part 150. Specifically, similar to the control signal Ctrl2, the control signal Ctrl3 is set to a high level when the switching element 110 is switched ON or OFF, and is set to a low level when the switching element 110 is not switched ON or OFF for a prescribed amount of time. When the control signal Ctrl3 is at the high level, the grasp determining part 150 discards the measurement result of the capacitance from the capacitance measuring circuit 140, and does not make a determination based on the capacitance (see arrow in FIG. 6). In other words, while switching the operation of the heater function, fluctuations in the power supply voltage may occur, and the accuracy of the measurement of the capacitance value by the capacitance measuring circuit 140 can be reduced, so the measurement result of such a capacitance value is discarded (the output value is made invalid). As a result, the reliability of grasp determination of the grasp determining part 150 can be improved.

As described above, according to the steering system 200, as a shielding function is added to the sensor electrode 14, effects of noise and the like can be suppressed without the use of a separate shielding member. Furthermore, as the presence or absence of grasp detection is controlled in response to switching the operation of the heater function, the reliability of the grasp detection function can be improved.

In another embodiment, the controller 120 may supply the capacitance measuring circuit 140 with the control signal Ctrl3, and when the control signal Ctrl3 is at a high level, the capacitance measuring circuit 140 does not perform measurement of the capacitance value. In yet another embodiment, the control signal Ctrl2 and the control signal Ctrl3 can be output from differing controllers, instead of the one controller 120. In a further different embodiment, the steering system 200 may include one of the functions, but not both of the functions, of the shielding function by the sensor electrode 14 and the function of discarding measurement results by the grasp determining part 150.

Here, regarding the steering system 200 provided with a heater function as described above, a harness or the like that electrically connects the heater electrode 12 and the elements can be disconnected based on deterioration or breakdown. For example, when the connection between the other end of the heater electrode 12 and ground is blocked by a disconnection, parasitic capacitance between the sensor electrode 14 and the heater electrode 12 does not occur. As a result of the measurement result obtained by the capacitance measuring circuit 140 changing, there is a risk that the reliability of grasping determination by the grasp determining part 150 may be reduced. Accordingly, the following embodiments 3 and 4 will be described as a steering system that can resolve this point.

3. Embodiment 3

As illustrated in FIG. 7, a steering system 300 further includes a connection determining part 310 in comparison with the steering system 100 described above. The connection determining part 310 is provided between one end of the heater electrode 12 and the heater power supply 130. The connection determining part 310 determines, for example, whether or not there is an electrical connection between the other end of the heater electrode 12 and the ground G (in other words, whether or not this connection is disconnected), and supplies a control signal Ctrl4 (example of a fourth control signal) that indicates the results of this determination to the controller 120.

When a disconnection occurs between the other end of the heater electrode 12 and the ground G, and the connection determining part 310 determines that there is no electrical connection therebetween, the controller 120 turns ON the switching element 110 based on the control signal Ctrl4 supplied by the connection determining part 310. This causes the heater electrode 12 to be short-circuited to the heater power supply 130, creating a parasitic capacitance between the heater electrode 12 and the sensor electrode 14.

According to the steering system 300 of the present embodiment, a parasitic capacitance can be generated between the sensor electrode 14 and the heater electrode 12 even if the electrical path including the heater electrode 12 is disconnected. Therefore, the reliability of the grasp detection function can be improved.

4. Embodiment 4

As illustrated in FIG. 8, a steering system 400 further includes a capacitor 410 in comparison with the steering system 100 described above. One end of the capacitor 410 is connected between one end of the heater electrode 12 and the heater power supply 130, and the other end is electrically connected to ground G. The capacitance of the capacitor 410 is preferably greater than the capacitance Csh of the parasitic capacitance generated between the sensor electrode 14 and the heater electrode 12, and can be, for example, 0.01 μF to 10 μF. Thus, the heater electrode 12 is put in a state equivalent to that of being shorted to the ground G. Thus, according to the steering system 400, the parasitic capacitance between the sensor electrode 14 and the heater electrode 12 can be generated even when an electrical path including the heater electrode 12 is disconnected, similar to the steering system 300. Therefore, the reliability of the grasp detection function can be improved.

Note that in FIG. 8, an example is illustrated in which one end of the capacitor 410 is connected between one end of the heater electrode 12 and the switching element 110. However, the position at which one end of the capacitor 410 is connected is not limited thereto, and for example, can be between the switching element 110 and the heater power supply 130. In FIG. 8, a configuration is illustrated in which the other end of the capacitor 410 is connected to the ground G, however, the connecting tip of the other end of the capacitor 410 is not limited thereto, and can be connected to the heater power supply 130, for example. In this case, the heater electrode 12 is put in a state equivalent to that of being shorted to power supply voltage, which can also generate a parasitic capacitance between the sensor electrode 14 and the heater electrode 12.

The embodiments described above are for ease of understanding of the present invention and are not intended to be construed as limiting the present invention. Each element included in each embodiment, as well as the arrangement, materials, conditions, shape, and size thereof, is not limited to those illustrated, but rather can be appropriately changed. In addition, the configurations shown in the various embodiments can be partially replaced or combined with each other.

For example, the device to which the heater function and the grasp detection function are applied is not limited to a steering wheel, and can be applied to other devices such as a shift lever of a vehicle and the like.

EXPLANATION OF CODES

1. Steering; 10. Core metal; 11. Urethane layer; 12. Heater electrode; 13. Epidermal layer; 14. Sensor electrode; 20. ECU; 21. Calculating part; 22. Communication part; 23. Input/output part; 24. Storage part; 100, 200, 300, 400. Steering system; 110. Switch element; 120. Controlling part; 130. Heater power supply; 140. Capacitance measuring circuit; 150. Grip determining part; 210. Switch element; 310. Connection determining part; 410. Capacitor

The invention claimed is:

1. A steering wheel, comprising:

a core part to which ground potential is supplied, a first conductor provided insulated from the core part on an exterior of the core part and electrically coupled with ground, the first conductor being for warming the steering wheel, a second conductor provided insulated from the first conductor on an exterior of the first conductor, the second conductor being for detecting grasping of the steering wheel, a first switching part that switches electrical connection between one end of the first conductor and a power supply ON and OFF based on a first signal, a controller that outputs the first control signal for controlling ON and OFF of the first switching part, a capacitance measuring circuit for measuring a capacitance of a capacitive coupling generated between the second conductor and ground, a grip determining part for determining whether or not the driver is gripping the steering wheel, and a second switching part that electrically switches ON and OFF between the second conductor and ground based on a second control signal, wherein the controller turns the second switching part ON upon switching of the first switching part and turns OFF the second switching part after the first switching part has not switched ON or OFF for a prescribed period of time, outputting the second control signal, wherein the prescribed period of time is a period of inactivity during which no ON-to-OFF or OFF-to-ON transition of the first switching part occurs.

2. The steering system according to claim 1, wherein if the driver is gripping the steering wheel, the capacitance measured by the capacitance measuring circuit includes the capacitance of the capacitance coupling generated in the path from the second conductor through the driver and to ground so the grip determining part determines that the driver is gripping the steering wheel if the capacitance measured by the capacitance measuring circuit increases by more than a prescribed threshold and determines that the driver has released grip on the steering wheel if the capacitance measured by the capacitance measuring circuit decreases by more than the prescribed threshold.

3. The steering system according to claim 1, wherein the controller outputs a third control signal that indicates switching of the first switching part ON or OFF, wherein the grip determining part discards the measurement results of the capacitance measuring circuit when the first switching part switches ON or OFF based on the third control signal.

4. The steering system according to claim 1, further comprising a connection determining part that determines whether or not there is electrical connection between an other end of the first conductor, the other end being opposite to the one end, and ground and supplies a fourth signal indicating the determination results to the controller, wherein if the connection determining part determines there is no electrical connection between the other end of the first conductor and ground, the controller switches the first switching part ON based on the fourth control signal.

5. The steering system according to claim 1, further comprising a capacitor with one end connected between one end of the first conductor and the power supply and the other end electrically connected to ground.

6. The steering system according to claim 1, further comprising a capacitor with one end connected between one end of the first conductor and the power supply and the other end electrically connected to the power supply.

7. In a method of controlling steering, the steering wheel is provided with a first conductor for warming the steering wheel, wherein the first conductor is electrically coupled to ground, and a second conductor insulated from the first conductor provided on the exterior of the first conductor; the method comprising a step of outputting a first control signal that controls the ON and OFF actions of a first switching part that switches an electrical connection between one end of the first conductor and a power supply, a step of receiving capacitance measurement results of the capacitance coupling generated between the second conductor and ground and determining whether or not the steering wheel is being grasped by the driver based on the measured capacitance, and a step of outputting a second signal for switching ON a second switching part that electrically connects between the second conductor and ground when the first switching part is switched ON or OFF and switching the second switching part OFF if the first switching part has not switched ON or OFF for a prescribed period of time.

8. The method according to claim 7, wherein the measured capacitance includes the capacitance coupling generated in the path from the second conductor through the driver and to ground if the driver is grasping the steering wheel, the determining step comprising determining the driver grasped the steering wheel if the measured capacitance increases by more than a prescribed threshold and determining the driver has released grip of the steering wheel if the measured capacitance decreases by more than the prescribed threshold.

9. The method according to claim 7 further comprising a step of outputting a third control signal that indicates switching ON and OFF of the first switching part, the determining step comprising discarding the measured capacitance when the first switching part switches ON or OFF based on the third control signal.

10. The method according to claim 7, further comprising a step of determining whether or not there is electrical connection between an other end of the first conductor, the other end being opposite the one end, and ground and outputting a fourth control signal indicating these determination results and a step of switching the first switching part ON based on the fourth control signal in the case of determining there to be no electrical connection between the other end of the first conductor and ground.

11. The method according to claim 7, the steering wheel further comprising a core part to which ground potential is supplied, the first conductor being provided on the exterior of the core part and insulated from the core part.

12. Non-temporary computer readable storage media storing one or more programs that are configured to be executed by one or more processors of an electronic device and one or more programs that allow the electronic device to control a steering wheel, the steering wheel comprising a first conductor for warming the steering wheel and a second conductor provided insulated from the first conductor on an exterior of the first conductor, wherein the one or more programs are configured to execute a process comprising:

issuing a command to output a first control signal to control ON and OFF actions of a first switching part to switch an electrical connection between one end of the first conductor and a power supply;

issuing a command to receive capacitance measurement results of capacitive coupling generated between the second conductor and ground;

determining whether or not a driver is grasping the steering wheel based on the measured capacitance; and issuing a command to output a second control signal to control ON and OFF actions of a second switching part to switch an electrical connection with the second conductor, the second control signal being operably linked with the first control signal, wherein the second control signal turns the second switching part OFF when the first switching part has not switched ON or OFF for a prescribed period of time.

13. The non-temporary computer readable storage media of claim 12, wherein the second control signal is operably linked with the first control signal such that actuation of the first switching part between ON and OFF results in actuation of the second switching part between OFF and ON.

14. The steering system of claim 1, wherein the controller determines that the first switching part has not switched ON or OFF by monitoring the absence of switching transitions during the prescribed period of time.

\*   \*   \*   \*   \*